United States Patent [19]
Nanba

[11] Patent Number: 5,315,554
[45] Date of Patent: May 24, 1994

[54] DYNAMIC RANDOM ACCESS MEMORY DEVICE WITH INTERMEDIATE VOLTAGE GENERATOR INTERRUPTING POWER SUPPLY IN TEST OPERATION

[75] Inventor: Yasuhiro Nanba, Tokyo, Japan
[73] Assignee: Nec Corporation, Tokyo, Japan
[21] Appl. No.: 52,675
[22] Filed: Apr. 27, 1993

[30] Foreign Application Priority Data
Apr. 28, 1992 [JP] Japan .................. 4-109409

[51] Int. Cl.⁵ ............................ G11C 29/00
[52] U.S. Cl. ......................... 365/201; 371/21.1
[58] Field of Search ........... 365/201; 371/21.1, 21.4

[56] References Cited
U.S. PATENT DOCUMENTS

| | | | |
|---|---|---|---|
| 4,459,686 | 7/1984 | Toyoda | 365/201 |
| 5,051,995 | 9/1991 | Tobita | 365/201 |
| 5,079,744 | 1/1992 | Tobita et al. | 365/201 |
| 5,157,629 | 10/1992 | Sato et al. | 365/201 |
| 5,208,777 | 5/1993 | Shibata | 365/201 |

Primary Examiner—Eugene R. LaRoche
Assistant Examiner—Son Dinh
Attorney, Agent, or Firm—Sughrue, Mion, Zinn, Macpeak & Seas

[57] ABSTRACT

When a dynamic random access memory device is powered with an external power voltage, a first intermediate voltage generator produces an intermediate voltage from the external power voltage for supplying to the counter electrodes of the storage capacitors of memory cells and a precharge unit, and the first intermediate voltage generator is replaced with a second intermediate voltage generator after the internal power voltage becomes stable, wherein a switch transistor blocks the counter electrodes and the precharge unit from the second intermediate voltage generator during a test operation on bit lines, thereby effectively screening out defective products.

5 Claims, 6 Drawing Sheets

DYNAMIC RANDOM ACCESS MEMORY DEVICE WITH INTERMEDIATE VOLTAGE GENERATOR INTERRUPTING POWER SUPPLY IN TEST OPERATION

FIELD OF THE INVENTION

This invention relates to a dynamic random access memory device and, more particularly, to a semiconductor dynamic random access memory device with an intermediate voltage generator interrupting power supply to the counter electrodes of storage capacitors and a precharge unit in a test operation on bit lines.

DESCRIPTION OF THE RELATED ART

A typical example of the dynamic random access memory device is illustrated in FIG. 1, and largely comprises a memory cell array 1, an addressing system 2, a data transmission system 3, a power supply system 4 and a controlling system 5.

The memory cell array 1 is fabricated from a plurality of memory cells arranged in rows and columns, and small bubbles stand for the plurality of memory cells. Each of the memory cells is implemented by a series combination of an n-channel enhancement type field effect transistor and a storage capacitor, and a data bit is memorized in the storage capacitor in the form of electric charges. A plurality of word lines WL1, WL2, WLm−1 and WLm are associated with the rows of memory cells, and are coupled with the gate electrodes of the n-channel enhancement type field effect transistors in the associated rows, respectively. A plurality of bit lines BL1, BL2, BLn−1 and BLn are associated with the columns of memory cells, and are respectively coupled with the drain nodes of the n-channel enhancement type field effect transistors in the associated columns. Every adjacent two bit lines such as BL1 and BL2 or BLn−1 and BLn are paired with each other, and form a bit line pair BLP1 or BLPi. Though not shown in FIG. 1, the counter electrodes of all the storage capacitors are coupled with a constant voltage line, and intermediate voltage HYC1P between positive internal power voltage level Vint and the ground voltage level. Row addresses are respectively assigned to the rows of memory cells and, accordingly, the word lines WL1 to WLm, and column addresses are respectively assigned to the columns of memory cells and, accordingly, the bit lines BL1 to BLn. For this reason, every memory cell is addressable with a row address and a column address.

The addressing system 2 is broken down into a row addressing sub-system for selecting one of the word lines WL1 to WLm and a column addressing sub-system for selecting one of the bit lines BL1 to BLn. Therefore, the row addressing sub-system and the column addressing sub-system selects one of the memory cells from the memory cell array 1.

The row addressing sub-system comprises a row address buffer unit 2a coupled with an address input port ADD and a row address decoder/word line driver unit 2b coupled with the word lines WL1 to WLm. Row address bits indicative of a row address are transferred from the address input port ADD to the row address buffer unit 2a, and the row address buffer unit 2a supplies the row address bits and the complementary row address bits to the row address buffer/word line driver unit 2b. The row address decoder/word line driver unit 2b recognizes the row address, and drives one of the word lines WL1 to WLm to active high voltage level. The word line driven to the active high voltage level allows the n-channel enhancement type field effect transistors coupled therewith to turn on, and the storage capacitors are conducted to the associated bit lines.

The column addressing sub-system comprises a column address buffer unit 2c and a column address decoder/column selector unit 2d. Column address bits indicative of a column address are transferred from the address input port ADD to the column address buffer unit 2c, and the column address buffer unit 2c supplies the column address bits and the complementary bits thereof to the column address decoder/column selector unit 2d. The column address decoder recognizes the column address, and the column selector becomes transparent to one of the data bits on the selected bit line pairs BLP1 to BLPi.

The data transferring system 3 comprises a sense amplifier unit/transfer gate array 3a, a data input buffer unit 3b, an input data amplifier unit 3c, an output data amplifier unit 3d, a data output buffer unit 3e, a precharge unit 3f and a dummy cell array 3g coupled with the bit lines B11 to BLn and selectively driven by dummy word lines. The precharge unit 3f charges and balances the bit line pairs at intermediate voltage level HVCD between the positive power voltage Vint and the ground voltage upon entry into a read-out cycle and into a read-out cycle.

The data input buffer 3b is coupled with an input data port Din, and an input data signal indicative of an input data bit is relayed from the input data port Din to the data input buffer unit 3b. The input data bit is further relayed from the data input buffer unit 3b to the input data amplifier unit 3c, and the input data amplifier unit 3c produces differential voltage from the input data bit. The differential voltage thus produced passes through the column selector unit to one of the bit line pairs BLP1 to BLPi, and the differential voltage is developed by the sense amplifier unit/transfer gate array 3a. One of the n-channel enhancement type field effect transistors coupled with the selected bit line pair has been already turned on, and either high or low voltage level is stored in the storage capacitor.

Data bits are read out from a row of memory cells to the bit line pairs BLP1 to BLPi, and the read-out data bits produce small differential voltages on the bit line pairs BLP1 to BLPi. The dummy word lines selectively activate the dummy cells 3g, and increases the differential voltages on the bit line pairs. The differential voltages are supplied to the sense amplifier unit/transfer gate array 3a, and the sense amplifier unit/transfer gate array 3a develops the differential voltages on the bit line pairs BLP1 to BLPi. One of the differential voltages is transferred through the column address decoder/column selector unit 2d to the output data amplifier unit 3d. The output data amplifier unit 3d produces an output data signal from the differential voltage, and the output data signal indicative of the read-out data bit is stored in the data output buffer unit 3e. Finally, the data output buffer unit 3e supplies the output data signal to an output data port Dout.

The power supply system 4 includes two intermediate voltage generators 4a and 4b, and the intermediate voltage generators 4a and 4b produce the intermediate voltages HVCD and HVC1P. While the power voltage level Vint is rising toward the constant level, the intermediate voltage generator 4a is enabled. However, after the power voltage level becomes stable, the other intermediate voltage generator 4b supplies the intermediate voltage levels HVCD and HVC1P.

The controlling system 5 includes a test signal generator 5a, and the test signal generator 5a is responsive to an external control signal applied to predetermined address pins of the address input port ADD for producing test control signals AGEING and AGEGND. As will be described hereinbelow, the test control signal AGEING and AGEGND are used for the intermediate voltage generator 4b. Although the systems 2 to 5 further include component units, the other component units are deleted from FIG. 1 for the sake of simplicity.

Turning to FIG. 2 of the drawings, the intermediate voltage generators 4a and 4b are illustrated in detail together with parts of the component units 1, 3g, 3f, 3a and 2d associated with one of the bit line pairs BLP1. The intermediate voltage generator 4a comprises a reference voltage generator 4c for producing a secondary reference voltage Vref2 from a primary reference voltage Vref1, a current mirror type voltage regulator 4d for regulating the intermediate voltage levels HVC1P and HVCD to the secondary reference voltage Vref2 and a transfer circuit 4e coupled between the voltage regulator 4d and the memory cell array 1 and the precharge unit 3f. The voltage regulator 4d is fabricated from p-channel enhancement type field effect transistors Q1 to Q4 and n-channel enhancement type field effect transistors Q5 to Q7, and the reference voltage generator 4c is implemented by a series combination of a p-channel enhancement type field effect transistor Q8 and two resistors R1 and R2. The transfer circuit 4e has two n-channel enhancement type field effect transistors Q9 and Q10 associated with the counter electrodes of the storage capacitors and the precharge unit 3f, respectively. The voltage regulator 4d is directly powered with an external power voltage level Vcc, and the regulated voltage level is supplied to the transfer circuit 4e.

The intermediate voltage generator 4b largely comprises a controller 4f responsive to the test control signals AGEING and AGEGND for producing control signals, and a switch array 4g responsive to the control signals. The controller comprises a NOR gate 4h and inverters 4i, 4j and 4k, and the test control signals AGEING and AGEGND are supplied to the inverter 4i and the NOR gate 4h and the NOR gate 4h and the inverter 4j, respectively. The switch array 4g comprises a p-channel enhancement type field effect transistor 4m and n-channel enhancement type field effect transistors 4n, 4o, 4p and 4q. An internal power voltage line Vint and an intermediate voltage Vint/2 are respectively supplied to the source node of the p-channel enhancement type field effect transistor 4m and the source nodes of the n-channel enhancement type field effect transistors 4n and 4q.

The intermediate voltage generators 4a and 4b thus arranged behave as follows. FIG. 3 illustrates job sharing between the intermediate voltage generators 4a and 4b. Assuming now that the dynamic random access memory device is powered at time t1, the primary reference signal Vref1 starts rising, and a monitoring circuit (not shown) compares the internal power voltage Vint with the primary reference voltage Vref1. While the internal power voltage level Vint is lower than the primary reference voltage Vref1, the monitoring circuit allows a status signal PONA to rise, and keeps another status signal PONB low. The status signal PONB is the complementary signal of the status signal PONA. If half of the internal power voltage level Vint/2 becomes equal to half of the primary reference voltage level Vref1 at time t2, the monitoring circuit pulls the status signal PONA down, and allows the other status signal PONB to go up immediately thereafter. The status signal PONA is supplied to the gate electrodes of the n-channel enhancement type field effect transistors Q7, Q9 and Q10, and the other status signal PONB is supplied to the gate electrode of the p-channel enhancement type field effect transistor Q8 and the gate electrodes of the n-channel enhancement type field effect transistors 4o and 4q. For this reason, while the status signal PONA is rising, the voltage regulator 4d is activated, and the intermediate voltage level HVC1P is regulated to the secondary reference voltage Vref2. When half of the intermediate voltage level HVC1P reaches the half of internal power voltage level Vint/2, the n-channel enhancement type field effect transistors Q9 and Q10 turn on, and the intermediate voltage levels HVC1P and HVCD are supplied through the transfer circuit 4e to the counter electrodes and the precharge unit 3f. However, the n-channel enhancement type field effect transistors 4o and 4q are turned off, and a voltage divider (not shown) can not supply the half of internal power voltage Vint/2 to the counter electrodes and the precharge unit 3f. Thus, the intermediate voltage generator 4a causes the intermediate voltage levels HVC1P and HVCD to rise between time t1 and time t2.

When the status signal PONA goes down and, accordingly, the other status signal PONB goes up, the intermediate voltage generator 4a is disabled as described hereinbefore, and is replaced with the other intermediate voltage generator 4b, because the status signal PONB allows the n-channel enhancement type field effect transistors 4o and 4q to turn on. While the test control signals AGEING and AGEGND remain low, the inverters 4i and 4k keep the p-channel enhancement type field effect transistor 4m and the n-channel enhancement type field effect transistor 4p off, and the NOR gate 4h allows the n-channel enhancement type field effect transistor 4n to turn on. Then, the voltage divider (not shown) supplies the half of internal power voltage level Vint/2 through the n-channel enhancement type field effect transistors 4n and 4o to the counter electrodes of the storage capacitors and through the n-channel enhancement type field effect transistor 4q to the precharge unit 3f. The test control signals AGEING and AGEGND are lifted to the high level only when the dynamic random access memory device is subjected to a parallel test so as to confirm whether or not the memory cells are excellent. Therefore, the test control signals AGEING and AGEGND are fixed to the low level after delivery from the manufacturer.

Thus, while the dynamic random access memory device is powered, the intermediate voltage levels HVC1P and HVCD are continuously applied to the counter electrodes of the storage capacitors and the source nodes of the n-channel enhancement type charging transistors of the precharge unit 3f.

A problem is encountered in reliability of the diagnosis carried out by the manufacturer. In detail, the intermediate voltage level HVC1P is applied to the counter electrodes of the storage capacitors immediately after the power-on, and tends to suppress leakage current across the dielectric films of the storage capacitors and from the source and drain regions of the component field effect transistors. The leakage currents are causative of defective bit lines, and the manufacturer checks the bit lines BL1 to BLn to see whether or not the bit lines have potential defects. However, the intermediate voltage levels HVC1p and HVCD suppress the leakage current, and the potential defects are hardly actualized during the diagnosis. This means that the potential defects are actualized after the delivery from the manufacturer, and users doubts the guarantee of the manufacturer.

SUMMARY OF THE INVENTION

It is therefore an important object of the present invention to provide a dynamic random access memory device which is improved in reliability.

To accomplish the object, the present invention proposes to block counter electrodes and a precharge unit from intermediate voltage levels in a test operation on bit lines.

In accordance with the present invention, there is provided a semiconductor dynamic random access memory device having standard modes and a diagnostic mode of operation, comprising: a) a memory cell array having a plurality of memory cells each addressable with a row address and a column address, each of the plurality of memory cells being implemented by a series combination of a switching transistor and a storage capacitor having an accumulated electrode and a counter electrode; b) an addressing means responsive to row and column address bits for selecting one of the plurality of memory cells; c) a plurality of bit lines selectively coupled with the plurality of memory cells, and conducted with the accumulating electrodes of the storage capacitors when the addressing means selects the memory cells; d) a precharge unit coupled with the plurality of bit lines for charging the plurality of bit lines to a first intermediate voltage level; e) a data input and output means selectively coupled with the plurality of bit lines for propagating a data bit between the one of the plurality of memory cells and a data port; f) an intermediate voltage producing means operative to supply the first intermediate voltage to the precharge unit and a second intermediate voltage to the counter electrodes of the storage capacitors in the standard modes; g) a diagnostic unit activated in the diagnostic mode, and producing a test control signal for carrying out at least a test operation on the bit lines to see whether or not leakage current flows therefrom; and h) a block means responsive to the test control signal for blocking the counter electrodes and the precharge unit from the first and second intermediate voltages during the test operation.

BRIEF DESCRIPTION OF THE DRAWINGS

The features and advantages of the dynamic random access memory device according to the present invention will be more clearly understood from the following description taken in conjunction with the accompanying drawings in which.

DESCRIPTION OF THE PREFERRED EMBODIMENT

Figure 1:
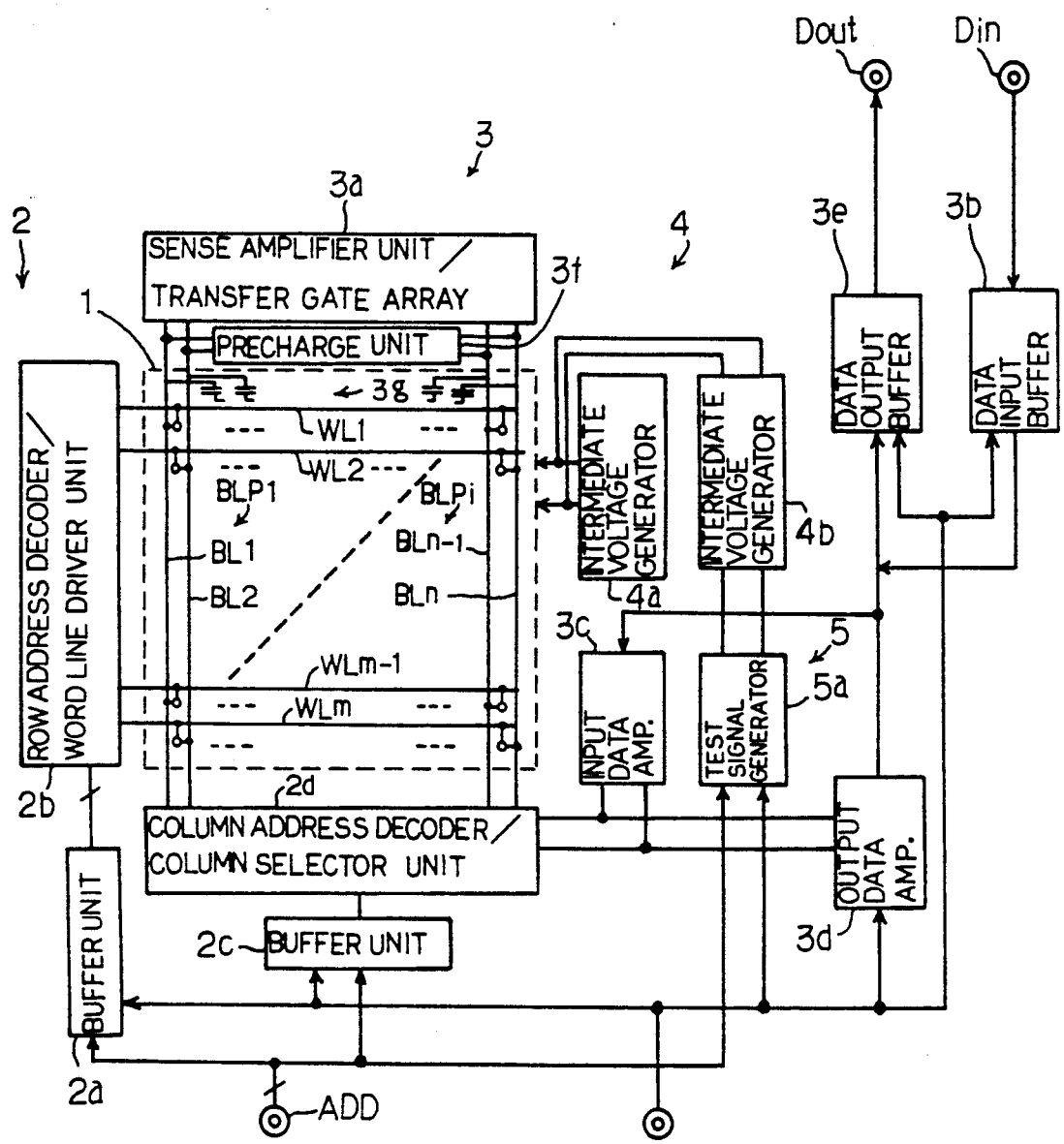
FIG. 1 is a block diagram showing the circuit arrangement of the prior art dynamic random access memory device.
Figure 2:
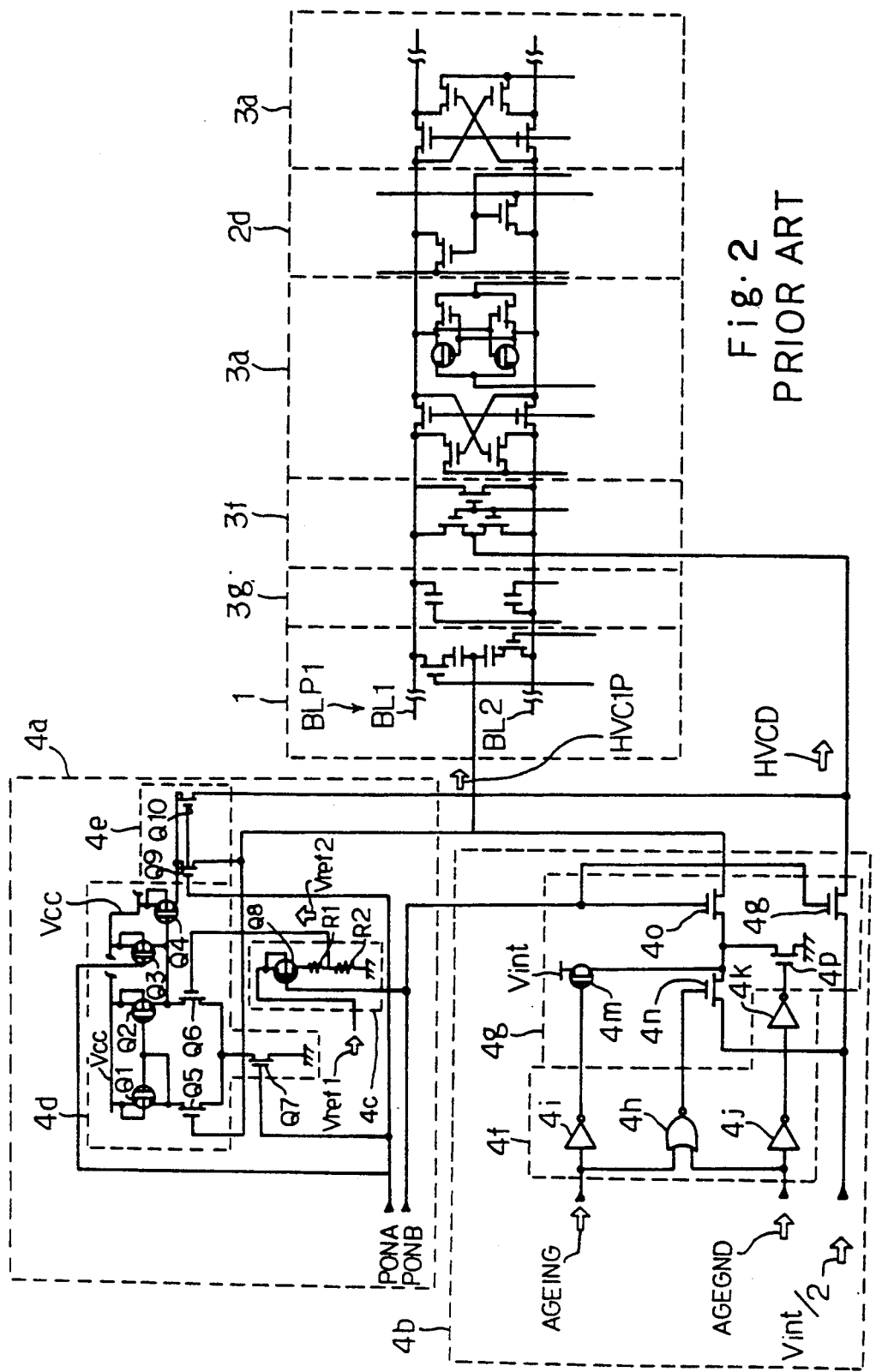
FIG. 2 is a circuit diagram showing the arrangements of the intermediate voltage generators incorporated in the prior art dynamic random access memory device.
Figure 3:
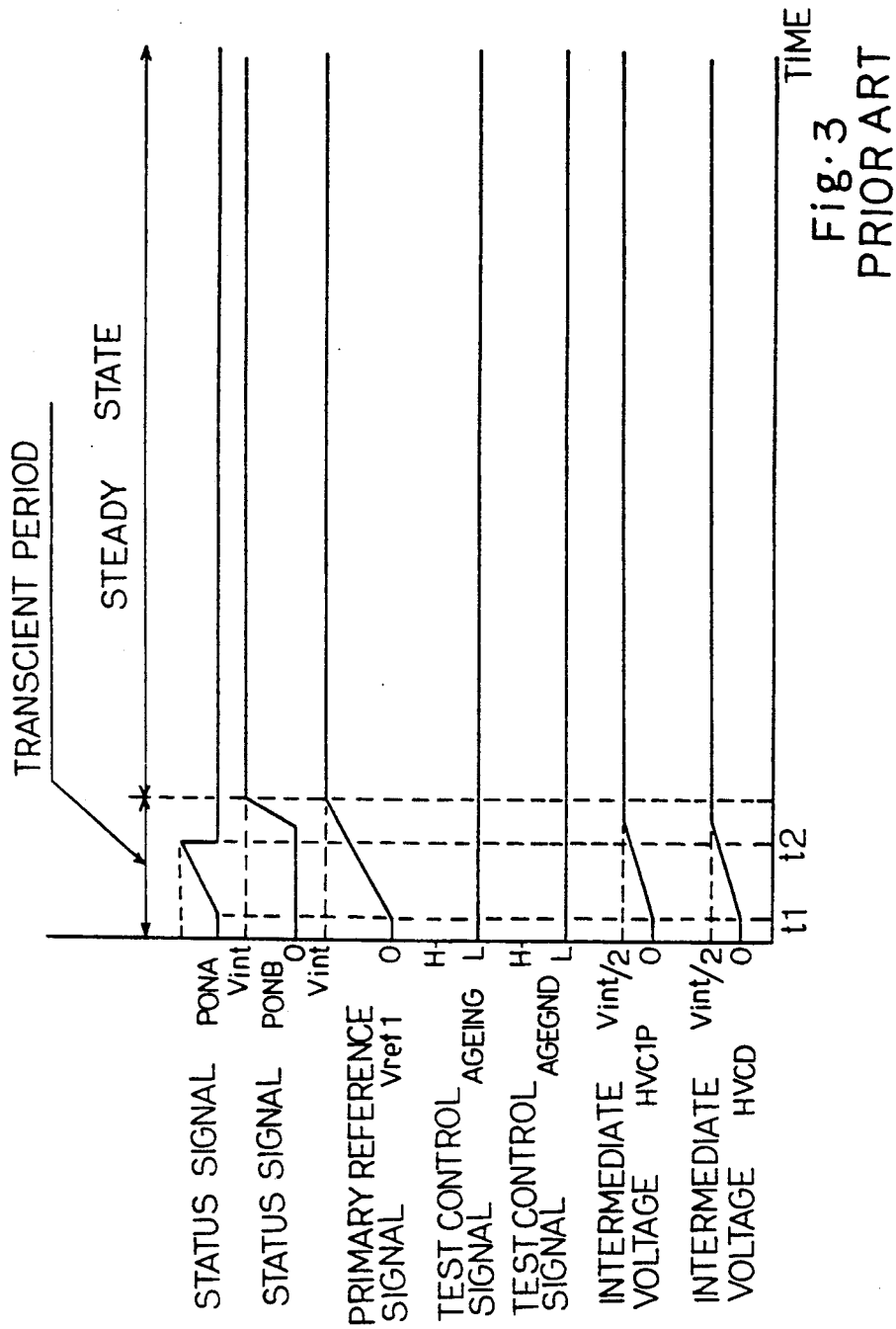
FIG. 3 is a diagram showing the circuit behavior of the intermediate voltage generators.
Figure 4:
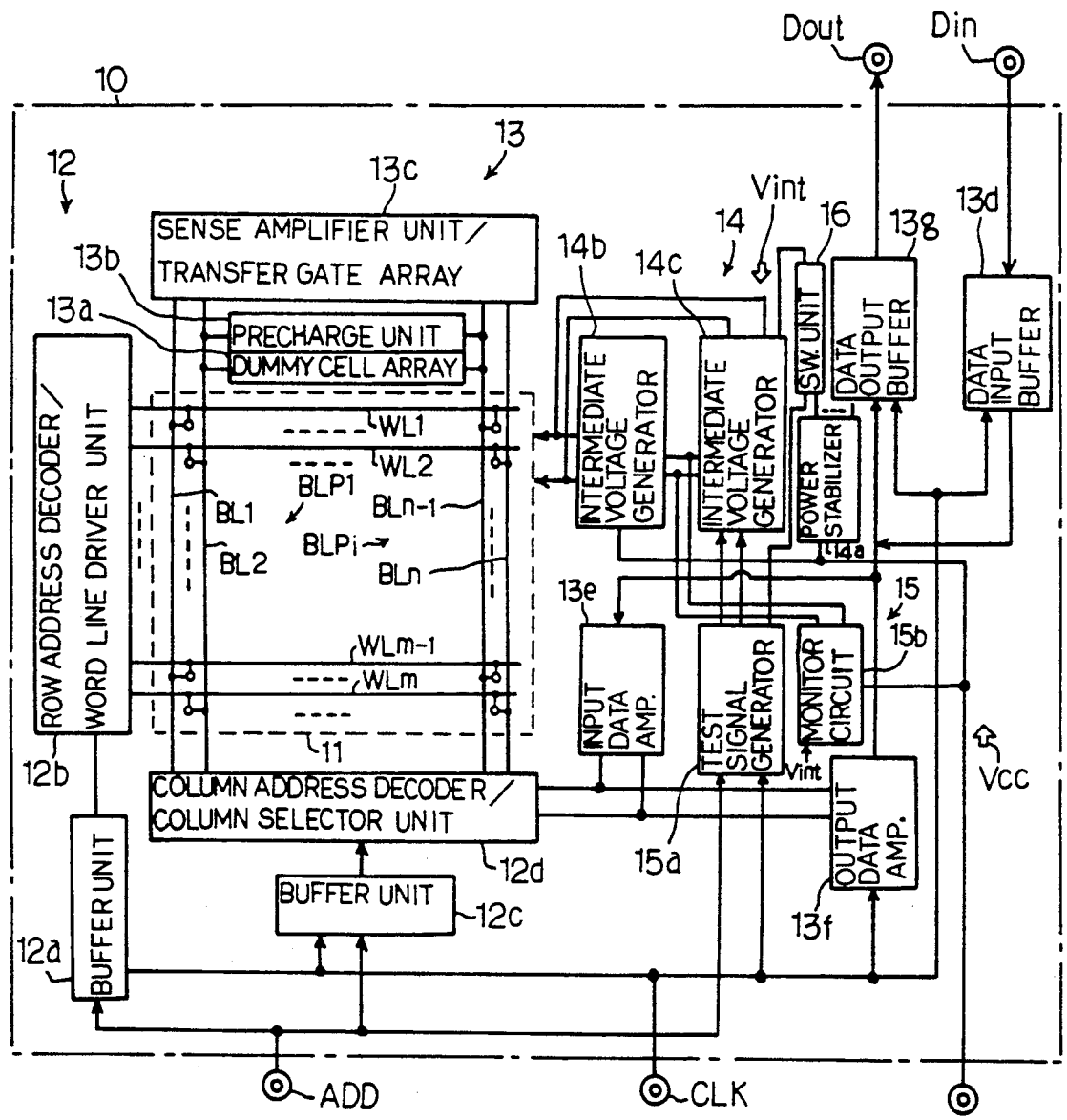
FIG. 4 is a block diagram showing the arrangement of a dynamic random access memory device according to the present invention.

Referring to FIG. 4 of the drawings, a dynamic random access memory device embodying the present invention is fabricated on a single semiconductor chip 10. The dynamic random access memory device largely comprises a memory cell array 11, an addressing system 12, a data transmission system 13, a power supply system 14, a controlling system 15 and a switching unit 16 serving as a blocking means. Although these systems 12 to 15 have component units illustrated in FIG. 4, the other component units are omitted for the sake of simplicity. A clock signal is supplied to a clock pin CLK, and gives appropriate timings to the component units.

The memory cell array 11 is fabricated from a plurality of memory cells arranged in rows and columns, and small bubbles stand for parts of the plurality of memory cells. Each of the memory cells is implemented by a series combination of an n-channel enhancement type field effect transistor $11a$ and a storage capacitor $11b$ (see FIG. 5), and a data bit is memorized in the accumulating electrode of the storage capacitor $11b$ in the form of electric charges. A plurality of word lines WL1, WL2, WLm−1 and WLm are associated with the rows of memory cells, and are coupled with the gate electrodes of the n-channel enhancement type field effect transistors $11a$ in the associated rows, respectively. A plurality of bit lines BL1, BL2, BLn−1 and BLn are associated with the columns of memory cells, and are respectively coupled with the drain nodes of the n-channel enhancement type field effect transistors $11a$ in the associated columns. Every adjacent two bit lines such as BL1 and BL2 or BLn−1 and BLn are paired with each other, and form a bit line pair BLP1 or BLPi. The counter electrodes of all the storage capacitors $11b$ are coupled with a constant voltage line S (see FIG. 5), and intermediate voltage HYC1P between positive internal power voltage level Vint and the ground voltage level. Row addresses are respectively assigned to the rows of memory cells and, accordingly, the word lines WL1 to WLm, and column addresses are respectively assigned to the columns of memory cells and, accordingly, the bit lines BL1 to BLn. For this reason, every memory cell is addressable with a row address and a column address.

The addressing system 12 is broken down into a row addressing sub-system for selecting one of the word lines WL1 to WLm and a column addressing sub-system for selecting one of the bit lines BL1 to BLn. Therefore, the row addressing sub-system and the column addressing sub-system selects one of the memory cells from the memory cell array 11.

The row addressing sub-system comprises a row address buffer unit $12a$ coupled with an address input port ADD and a row address decoder/word line driver unit $12b$ coupled with the word lines WL1 to WLm. Row address bits indicative of a row address are transferred from the address input port ADD to the row address buffer unit 12a, and the row address buffer unit 12a supplies the row address bits and the complementary row address bits to the row address buffer/word line driver unit 12b. The row address decoder/word line driver unit 12b recognizes the row address, and drives one of the word lines WL1 to WLm to active high voltage level. The word line driven to the active high voltage level allows the n-channel enhancement type field effect transistors 11b coupled therewith to turn on, and the storage capacitors 11b are conducted to the associated bit lines.

The column addressing sub-system comprises a column address buffer unit 12c and a column address decoder/column selector unit 12d. Column address bits indicative of a column address are transferred from the address input port ADD to the column address buffer unit 12c, and the column address buffer unit 12c supplies the column address bits and the complementary bits thereof to the column address decoder/column selector unit 12d. The column address decoder recognizes the column address, and the column selector becomes transparent to one of the data bits on the selected bit line pairs BLP1 to BLPi.

The data transferring system 13 comprises a dummy cell array 13a, a precharge unit 13b, a sense amplifier unit/transfer gate array 13c, a data input buffer unit 3d, an input data amplifier unit 13e, an output data amplifier unit 13f, and a data output buffer unit 13g. The data transferring system repeats amplification, and transfers a read-out data bit and a write-in data bit between the memory cell array 11 and a data output port Dout and a data input port Din.

Figure 5:
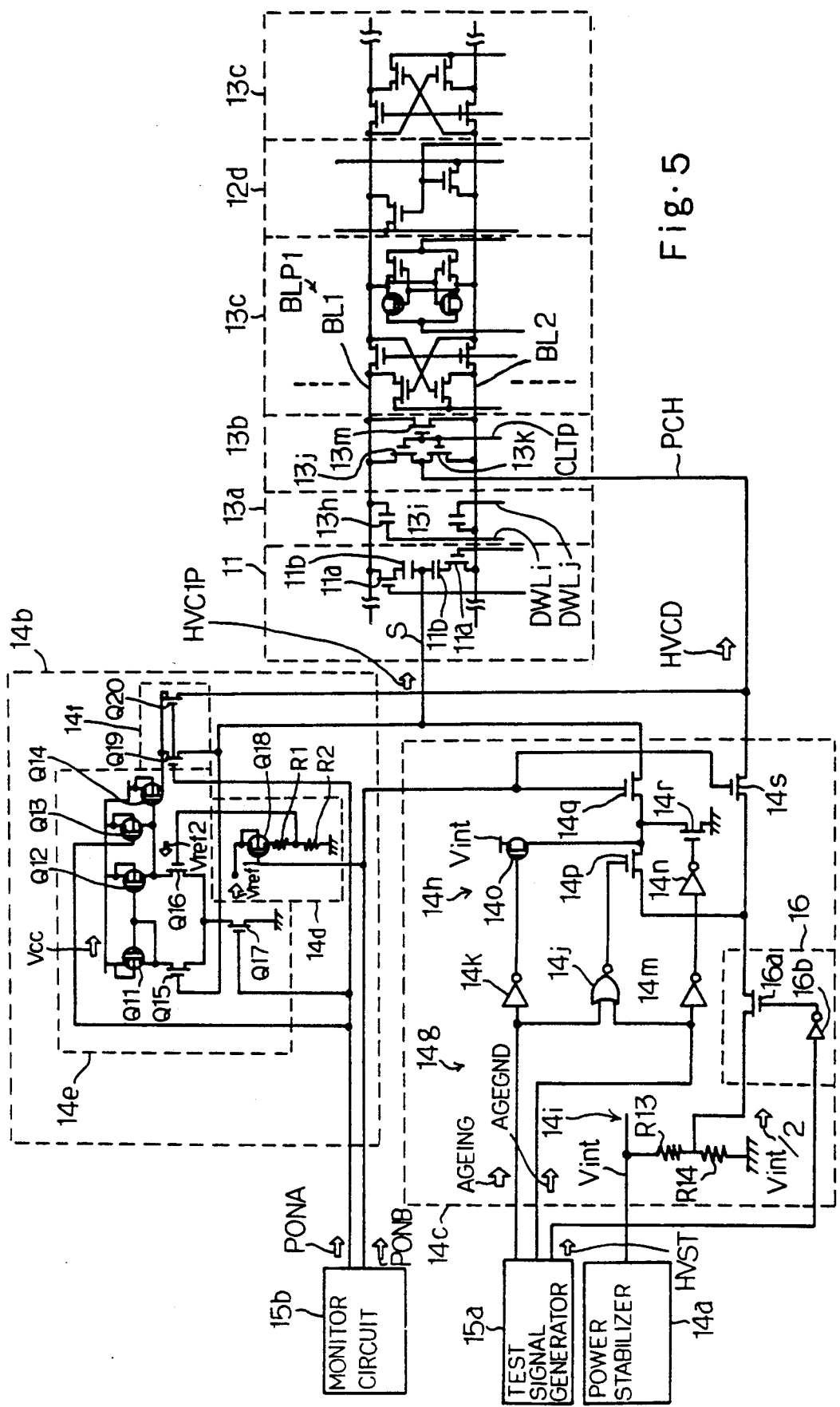
FIG. 5 is a circuit diagram showing the arrangements of intermediate voltage generators incorporated in the dynamic random access memory device shown in FIG. 4.

As will be seen from FIG. 5, the dummy cell array 13a comprises capacitors such as 13h and 13i respectively coupled with the bit lines BL1 to BLn, and selectively driven by dummy word lines DWLi and DWLj. If a selected word line allows a row of memory cells to be conducted with bit lines, the dummy word lines DWLi or DWLj causes the dummy cell array 13a to change the voltage levels on the opposite bit lines in such a manner as to increase the differences therebetween.

The precharge unit 13b comprises n-channel enhancement type charging transistors such as 13j and 13k coupled between a precharge voltage line PCH and the bit lines BL1 to BLn and an n-channel enhancement type balancing transistors such as 13m coupled between the paired bit lines. An intermediate voltage level HVCD between the positive internal power voltage level Vint and the ground voltage level is supplied from the precharge voltage line PCH to the n-channel enhancement type charging transistors 13j and 13k. The n-channel enhancement type charging transistors 13j and 13k and the n-channel enhancement type balancing transistors 13m are responsive to a precharge control signal CLTp, and charge and balance the bit line pairs BLP1 to BLPi at the intermediate voltage level HVCD upon entry into a read-out sequence and into a read-out sequence.

Turning back to FIG. 4, the data input buffer 13d is coupled with the data input port Din, and an input data signal indicative of an input data bit is relayed from the data input port Din to the data input buffer unit 13d. The input data bit is further relayed from the data input buffer unit 13d to the input data amplifier unit 13e, and the input data amplifier unit 13e produces differential voltage from the input data bit. The differential voltage thus produced passes through the column selector unit to one of the bit line pairs BLP1 to BLPi, and the differential voltage is developed by the sense amplifier unit/transfer gate array 13c. One of the n-channel enhancement type field effect transistors 11a coupled with the selected bit line pair has been already turned on, and either high or low voltage level is stored in the storage capacitor 11b.

Data bits are read out from a selected row of memory cells to the bit line pairs BLP1 to BLPi, and the read-out data bits produce small differential voltages on the bit line pairs BLP1 to BLPi. The dummy word lines selectively activate the dummy cell array 13a, and increases the differential voltages on the bit line pairs BLP1 to BLPi. The differential voltages are supplied to the sense amplifier unit/transfer gate array 13c, and the sense amplifier unit/transfer gate array 13c develops the differential voltages on the bit line pairs BLP1 to BLPi. One of the differential voltages is transferred through the column address decoder/column selector unit 12d to the output data amplifier unit 13e. The output data amplifier unit 13e produces an output data signal from the differential voltage, and the output data signal indicative of the read-out data bit is stored in the data output buffer unit 13g. Finally, the data output buffer unit 13g supplies the output data signal to the data output port Dout.

The power supply system 14 includes a power stabilizer 14a and two intermediate voltage generators 14b and 14c, and the power stabilizer 14a produces the positive internal power voltage Vint from an external power voltage level Vcc. The internal power voltage Vint is distributed to component units as well as to the intermediate voltage generator 14c. The intermediate voltage generators 14b and 14c are selectively activated, and produce the intermediate voltages HVCD and HVC1P. Namely, while the internal power voltage level Vint is rising toward the constant level, the intermediate voltage generator 14b supplies the intermediate voltages HVC1P and HVCD to the constant voltage line S and the precharge voltage line PCH. However, after the power voltage level becomes stable, the intermediate voltage generator 1b is replaced with the other intermediate voltage generator 14c.

The controlling system 15 includes a test signal generator 15a and a monitoring circuit 15b, and the test signal generator 15a is responsive to an external control signal applied to predetermined address pins of the address input port ADD for producing test control signals AGEING, AGEGND and HVST. The test control signal AGEING and AGEGND are indicative of a parallel test operation to see whether or not the memory cells are excellent, and are supplied to the intermediate voltage generator 14c for selectively applying the internal power voltage and the ground voltage level to the counter electrodes of the storage capacitors 11b. The switching unit 16 comprises an n-channel enhancement type field effect transistor 16a and an inverter 16b, and the n-channel enhancement type field effect transistor 16a is responsive to the complementary signal of the test control signal HVST. The test control signal HVST is indicative of a test operation on the bit lines BL1 to BLn, and is supplied to the switching unit 16 as will be described hereinlater.

Turning to FIG. 5 of the drawings again, the intermediate voltage generators 14b and 14c are illustrated in detail together with parts of the component units 11, 13a, 13b, 13c and 12d associated with one of the bit line pairs BLP1. The intermediate voltage generator 14b comprises a reference voltage generator 14d for producing a secondary reference voltage Vref2 from a primary reference voltage Vref1, a current mirror type voltage regulator 14e for regulating the intermediate voltage levels HVC1P and HVCD to the secondary reference voltage Vref2 and a transfer circuit 14f coupled between the voltage regulator 4d and the constant voltage line S and the precharge voltage line PCH.

The current mirror type voltage regulator 14e is fabricated from p-channel enhancement type field effect transistors Q11 to Q14 and n-channel enhancement type field effect transistors Q15 to Q17, and the reference voltage generator 14d is implemented by a series combination of a p-channel enhancement type field effect transistor Q18 and two resistors R11 and R12. The transfer circuit 14f has two n-channel enhancement type field effect transistors Q19 and Q20 associated with the constant voltage line S and the mirror type voltage regulator 14e is directly powered with the external power voltage level Vcc, and the regulated voltage level is supplied to the transfer circuit 14f.

The intermediate voltage generator 14c largely comprises a controller 14g, a switch array 14h and a voltage divider 14i. The controller 14g is responsive to the test control signals AGEING and AGEGND, and controls the switch array 14h. The controller 14g comprises a NOR gate 14j and inverters 14k, 14m and 14n, and the test control signals AGEING and AGEGND are supplied to the inverter 14k and the NOR gate 14j and the NOR gate 14j and the inverter 14m, respectively. The switch array 14h comprises a p-channel enhancement type field effect transistor 14o and n-channel enhancement type field effect transistors 14p, 14q, 14r and 14s. The internal power voltage line Vint is supplied to the source node of the p-channel enhancement type field effect transistor 14o, and the switch unit 16 is coupled between the voltage divider 14i and the source nodes of the n-channel enhancement type field effect transistors 14p and 14s. The voltage divider 14i is implemented by a series combination of resistors R13 and R14 coupled between the internal power voltage line Vint and the ground voltage line, and supplies an intermediate voltage level Vint/2 to the switch unit 16.

The monitoring circuit 15b comprises a voltage divider for producing the primary reference signal Vref1 from the external power voltage Vcc, two additional voltage dividers for producing intermediate voltages Vref1/2 and Vint/2 between the primary reference signal Vref1 and the ground voltage level and between the internal power voltage level Vint and the ground voltage level, and a comparator operative to compare the intermediate voltage level Vint/2 with the other intermediate voltage level Vref1/2. While the intermediate voltage level Vint/2 is lower than the intermediate voltage level Vref1/2, the monitoring circuit allows a status signal PONA to be in the high voltage level, and keeps another status signal PONB low. The status signal PONB is the complementary signal of the status signal PONA. However, if half of the intermediate voltage level Vint/2 becomes equal to the intermediate voltage level Vref1/2, the monitoring circuit pulls the status signal PONA down, and allows the other status signal PONB to go up immediately thereafter.

Figure 6:
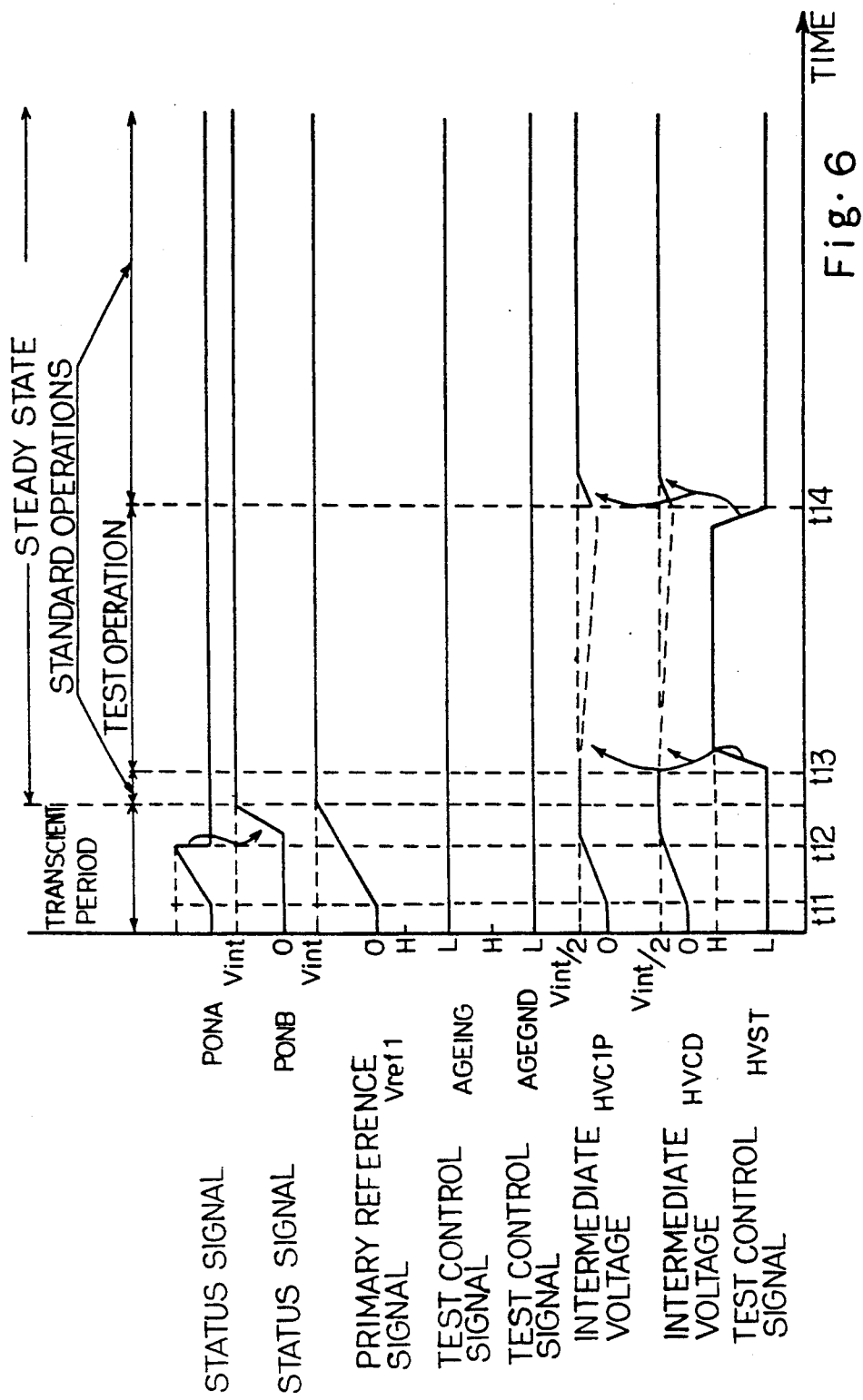
FIG. 6 is a diagram showing the circuit behavior of the intermediate voltage generators.

The intermediate voltage generators 14b and 14c and the switch unit 16 thus arranged behave as follows. FIG. 6 illustrates the job sharing between the intermediate voltage generators 14b and 14c as well as a test operation on the bit lines BL1 to BLn. Assuming now that the dynamic random access memory device is powered at time t11, the primary reference signal Vref1 starts rising, and the monitoring circuit 15b compares the intermediate voltage level Vint/2 with the intermediate voltage Vref1/2. While the intermediate voltage level Vint/2 is lower than the intermediate voltage level Vref1/2, the monitoring circuit 15b allows the status signal PONA to rise, and keeps the status signal PONB low. If the intermediate voltage level Vint/2 becomes equal to the intermediate voltage level Vref1/2 at time t12, the monitoring circuit 15b pulls the status signal PONA down, and allows the other status signal PONB to go up immediately thereafter.

The status signal PONA is supplied to the gate electrodes of the n-channel enhancement type field effect transistors Q17, Q19 and Q20, and the other status signal PONB is supplied to the gate electrode of the p-channel enhancement type field effect transistor Q18 and the gate electrodes of the n-channel enhancement type field effect transistors 14q and 14s. For this reason, while the status signal PONA is rising, the current mirror type voltage regulator 14d is activated, and the intermediate voltage level HVC1P is regulated to the secondary reference voltage Vref2. When half of the intermediate voltage level HVC1P reaches the intermediate voltage level Vint/2, the n-channel enhancement type field effect transistors Q19 and Q20 turn on, and the intermediate voltage levels HVC1P and HVCD are supplied through the transfer circuit 4e to the constant voltage line S and the precharge voltage line PCH. However, the status signal PONB keeps the n-channel enhancement type field effect transistors 14q and 14s off, and the voltage divider 14i is isolated from the constant voltage line S and the precharge voltage line PCH. Thus, the intermediate voltage generator 14b supplies the intermediate voltage levels HVC1P and HVCD to the constant voltage line S and the precharge voltage line PCH between time t11 and time t12.

When the status signal PONA goes down and, accordingly, the other status signal PONB goes up, the intermediate voltage generator 14b is disabled as described hereinbefore, and is replaced with the other intermediate voltage generator 14c, because the status signal PONB allows the n-channel enhancement type field effect transistors 14q and 14s to turn on. While the test control signals AGEING, AGEGND and HVST remain low, the inverters 14k and 14n keep the p-channel enhancement type field effect transistor 14o and the n-channel enhancement type field effect transistor 14r off, and the NOR gate 14j allows the n-channel enhancement type field effect transistor 14p to turn on. The inverter 16b produces the complementary signal of the test control signal HVST, and the complementary signal keeps the n-channel enhancement type field effect transistor 16a in the on-state. Then, the voltage divider 14i supplies the intermediate voltage level Vint/2 through the n-channel enhancement type field effect transistors 16a, 14p and 14q to the counter electrodes of the storage capacitors 11b and through the n-channel enhancement type field effect transistors 16a and 14s to the precharge unit 13b. Thus, the intermediate voltage generator 14c supplies the intermediate voltage levels HVC1P and HVCD to the constant voltage line S and the precharge voltage line PCH after time t12.

While the test control signals AGEING, AGEGND and HVST remain low, the dynamic random access memory device is in the standard modes of operation, i.e., the write-in mode, the read-out mode and a refresh mode. However, the manufacturer carries out various test operations, and the dynamic random access memory device enters a diagnostic mode of operation. If a write enable signal goes down in a CAS-before-RAS refresh cycle, the dynamic random access memory device is subjected to a 16-bit parallel test, and the test control signals AGEING and AGEGND are selectively lifted to the high voltage level so that the counter electrodes are applied with the internal power voltage Vint and the ground voltage.

Subsequently, if the test control signal HVST is lifted to the high voltage level for the test operation on the bit lines at time t13, the inverter 16b applies the low voltage level to the gate electrode of the n-channel enhancement type field effect transistor 16a, and the n-channel enhancement type field effect transistor 16a blocks the constant voltage line S and the precharge voltage line PCH from the voltage divider 14i. Then, the counter electrodes and the precharge unit 13b enter floating state, and voltage levels thereon are decayed due to the leakage current. As a result, potential defects of the bit lines BL1 to BLn are effectively actualized, and the test operation enhances the reliability of the products.

If the test operation on the bit lines BL1 to BLn is completed at time t14, the test control signal HVST goes up again, and the constant voltage line S and the precharge voltage line PCH are coupled with the voltage divider 14i again.

As will be appreciated from the foregoing description, the switch unit 16 effectively cuts off the intermediate voltages HVC1P and HVCD, and actualizes potential defect of the bit lines.

Although the particular embodiment of the present invention has been shown and described, it will be obvious to those skilled in the art that various changes and modifications may be made without departing from the spirit and scope of the present invention. For example a dynamic random access memory device according to the present invention may form a part of a large scale integration or be fabricated on a plurality of semiconductor chips. Moreover, a memory cell array incorporated in a dynamic random access memory device according to the present invention may be broken down into a plurality of memory cell sub-arrays. Finally, the n-channel enhancement type field effect transistor 16a is replaceable with a p-channel enhancement type field effect transistor, and the p-channel enhancement type field effect transistor allows the manufacturer to delete the inverter 16b.

What is claimed is:

1. A semiconductor dynamic random access memory device having standard modes and a diagnostic mode of operation, comprising:
   a) a memory cell array having a plurality of memory cells each addressable with a row address and a column address, each of said plurality of memory cells being implemented by a series combination of a switching transistor and a storage capacitor having an accumulated electrode and a counter electrode;
   b) an addressing means responsive to row and column address bits for selecting one of said plurality of memory cells;
   c) a plurality of bit lines selectively coupled with said plurality of memory cells, and conducted with the accumulating electrodes of the storage capacitors when said addressing means selects the memory cells;
   d) a precharge unit coupled with said plurality of bit lines for charging said plurality of bit lines to a first intermediate voltage level;
   e) a data input and output means selectively coupled with said plurality of bit lines for propagating a data bit between said one of said plurality of memory cells and a data port;
   f) an intermediate voltage producing means operative to supply said first intermediate voltage to said precharge unit and a second intermediate voltage to the counter electrodes of the storage capacitors in said standard modes;
   g) a diagnostic unit activated in said diagnostic mode, and producing a test control signal for carrying out at least a test operation on said bit lines to see whether or not leakage current flows therefrom; and
   h) a block means responsive to said test control signal for blocking said counter electrodes and said precharge unit from said first and second intermediate voltages during said test operation.

2. A dynamic random access memory device as set forth in claim 1, in which said intermediate voltage producing means comprises
   f-1) a first intermediate voltage generator operative to produce said first and second intermediate voltages in a transient period after said dynamic random access memory device is powered, and
   f-2) a second intermediate voltage generator operative to produce said first and second intermediate voltages after said transient period, said test operation being carried out after said transient period.

3. A dynamic random access memory device as set forth in claim 2, in which said second intermediate voltage generator comprises a voltage divider operative to produce said first and second intermediate voltages from an internal power voltage, and a switching array coupled between said voltage divider and said counter electrodes and said precharge unit, and in which said block means comprises
   h-1) an inverter operative to produce a complementary signal of said test control signal, and
   h-2) a switching transistor coupled between said voltage divider and said switching array, and responsive to said complementary signal.

4. A semiconductor memory device comprising:
   a) two pairs of bit line electrodes each coupled with a plurality of memory cells and a pair of dummy cells;
   b) a node for supplying an intermediate voltage level to counter electrodes of memory capacitors incorporated in said plurality of memory cells;
   c) an intermediate voltage producing circuit for supplying said intermediate voltage produced from an internal power voltage to said bit line electrodes; and
   d) a test mode generating circuit for supplying test mode signals to said intermediate voltage producing circuit, characterized by
   e) a means responsive to first, second and third test mode signals for interrupting said intermediate voltage to said counter electrodes and said bit line electrodes.

5. A semiconductor memory device comprising:
   a) two pairs of bit line electrodes each coupled with a plurality of memory cells and a pair of dummy cells;

b) a node for supplying an intermediate voltage level to counter electrodes of memory capacitors incorporated in said plurality of memory cells;

c) an intermediate voltage producing circuit for supplying said intermediate voltage produced from an internal power voltage to said bit line electrodes;

d) a test mode generating circuit for supplying test mode signals to said intermediate voltage producing circuit; and e) a means responsive to first, second and third test mode signals for interrupting said intermediate voltage to said counter electrodes and said bit line electrodes, and including e-1) a first insulating gate type field effect transistor having a first node supplied with said intermediate voltage level and a gate electrode supplied with a complementary signal of said first test mode signal, e-2) a second insulating gate type field effect transistor having a first node coupled with a second node of said first insulating gate type field effect transistor, e-3) a third insulating gate type field effect transistor having a first node coupled with said second node of said first insulating gate type field effect transistor, e-4) a fourth insulating gate type field effect transistor having a gate electrode supplied with said second test mode signal through a first inverter and a first electrode coupled with a high power voltage line, e-5) a fifth insulating gate type field effect transistor having a gate electrode supplied with said third test mode signal through second and third inverters and a first electrode coupled with a ground voltage line, e-6) a NOR gate supplied with said second and third test mode signals, and having an output node coupled with a gate electrode of said second insulating gate type field effect transistor, e-7) a sixth insulating gate type field effect transistor having a gate electrode supplied with a power-on signal, said power-on signal being further supplied to a gate electrode of said third insulating gate type field effect transistor, a second node of said second insulating gate type field effect transistor being coupled with a second node of said fifth insulating gate type field effect transistor, a second node of said fourth insulating gate type field effect transistor and a first node of said sixth insulating gate type field effect transistor, e-8) a first output node coupled with a second node of said sixth insulating gate type field effect transistor for supplying said intermediate voltage level to said node for supplying said intermediate voltage level to said counter electrodes, and e-9) a second output node coupled with a second node of said third insulating gate type field effect transistor for supplying said intermediate voltage level to said bit line electrodes.

* * * * *

UNITED STATES PATENT AND TRADEMARK OFFICE
CERTIFICATE OF CORRECTION

PATENT NO. : 5,315,554
DATED : May 24, 1994
INVENTOR(S) : Yasuhiro Nanba

It is certified that error appears in the above-identified patent and that said Letters Patent is hereby corrected as shown below:

Assignee: delete "Nec" and insert --NEC--;

Col. 9, line 18, after "the" insert --precharge voltage line PCH, respectively. The current--.

Signed and Sealed this

First Day of November, 1994

Attest:

BRUCE LEHMAN

Attesting Officer        Commissioner of Patents and Trademarks